United States Patent
Chuang et al.

(10) Patent No.: US 8,334,196 B2
(45) Date of Patent: Dec. 18, 2012

(54) METHODS OF FORMING CONDUCTIVE CONTACTS IN THE FABRICATION OF INTEGRATED CIRCUITRY

(75) Inventors: Ying-Cheng Chuang, Boise, ID (US);
Hung-Ming Tsai, Boise, ID (US);
Sheng-Wei Yang, Boise, ID (US);
Ping-Cheng Hsu, Boise, ID (US);
Ming-Cheng Chang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 12/917,339

(22) Filed: Nov. 1, 2010

(65) Prior Publication Data
US 2012/0108047 A1   May 3, 2012

(51) Int. Cl.
*H01L 21/768*   (2006.01)
*H01L 21/28*   (2006.01)

(52) U.S. Cl. ................. 438/586; 438/675; 257/E21.585; 257/E21.19

(58) Field of Classification Search ........................ None
See application file for complete search history.

(56) References Cited

U.S. PATENT DOCUMENTS

| | | |
|---|---|---|
| 6,747,306 B1 | 6/2004 | Dyer |
| 6,967,140 B2 | 11/2005 | Doyle |
| 7,183,156 B2 | 2/2007 | Goldbach et al. |
| 7,488,660 B2 | 2/2009 | Dyer et al. |
| 7,741,682 B2 | 6/2010 | Sukekawa |
| 2009/0206400 A1 | 8/2009 | Juengling |
| 2009/0224357 A1 | 9/2009 | Juengling |
| 2009/0237996 A1 | 9/2009 | Kirsch et al. |
| 2009/0238010 A1 | 9/2009 | Juengling |
| 2009/0294842 A1 | 12/2009 | Juengling |
| 2010/0066440 A1 | 3/2010 | Juengling |

*Primary Examiner* — Seahvosh Nikmanesh
(74) *Attorney, Agent, or Firm* — Wells St. John, P.S.

(57) ABSTRACT

A method of forming a conductive contact includes forming a structure comprising an upper surface joining with a sidewall surface. The sidewall surface contains elemental-form silicon. Silicon is epitaxially grown from the sidewall surface. Dielectric material is formed over the upper surface and the epitaxially-grown silicon. A conductive contact is formed through the dielectric material to conductively connect with the upper surface.

26 Claims, 11 Drawing Sheets

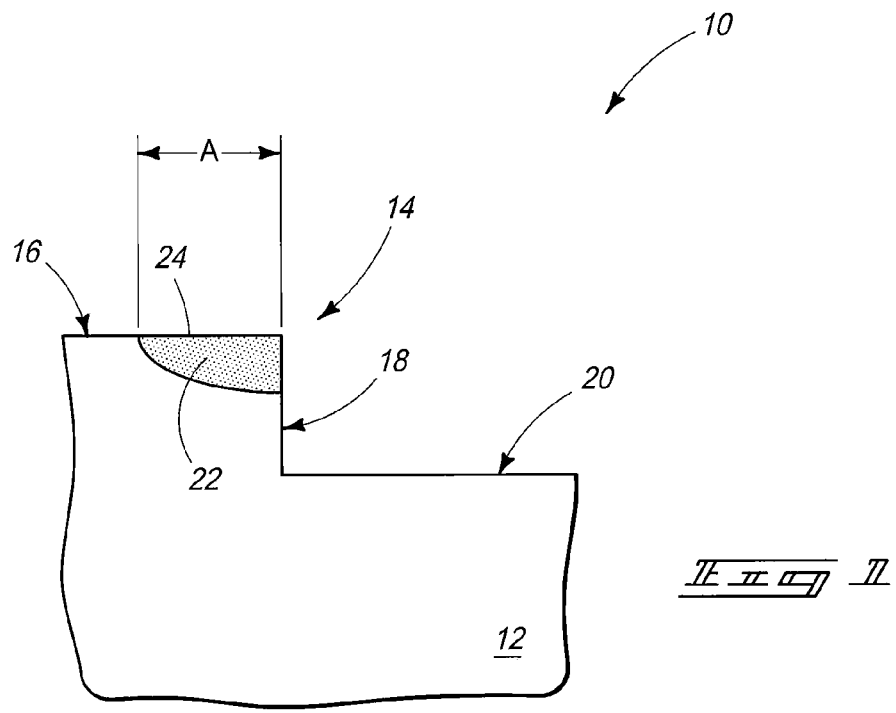
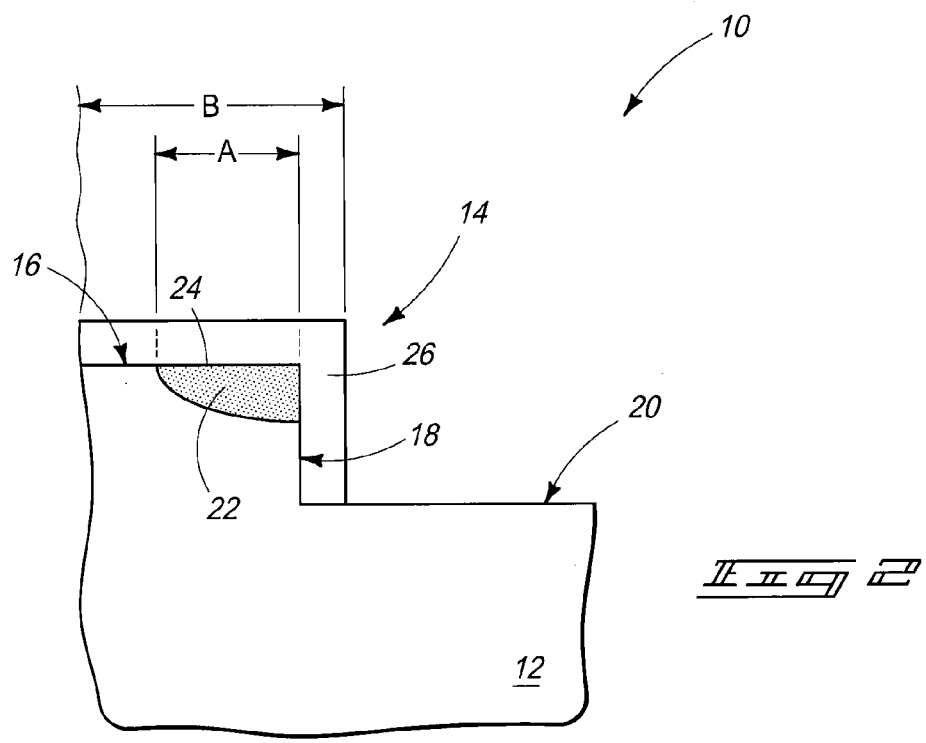

$\boxed{\mathrm{F\,\bar{z}\,\bar{\sigma}\quad\mathcal{I}\,\mathcal{I}\,\overline{\mathcal{II}}}}$

US 8,334,196 B2

METHODS OF FORMING CONDUCTIVE CONTACTS IN THE FABRICATION OF INTEGRATED CIRCUITRY

TECHNICAL FIELD

Embodiments disclosed herein pertain to methods of forming conductive contacts in the fabrication of integrated circuitry.

BACKGROUND

In the fabrication of integrated circuitry, components at different elevations may be electrically interconnected. For example, an insulating/dielectric material may be deposited over a lower component, and an opening etched therethrough to expose an area of the lower component to which electrical connection is to be made. The opening is filled with conductive material which may then be used in the fabrication of another conductive component or in making electrical connection with another conductive component.

It is desirable to precisely align the opening which is etched in the dielectric material to the contact area for the lower component. The individual circuit components continue to be fabricated to increasingly small lateral dimensions resulting in the contact areas for the smaller devices shrinking as well. If the opening in the dielectric material does not sufficiently overlie the contact area of the underlying component, no electrical connection may be made, and may result in inoperable circuitry.

While the invention was motivated in addressing the above-identified issues, it is no way so limited. Rather, the invention is limited by the accompanying claims as literally worded and as appropriately interpreted in accordance with the doctrine of equivalence.

BRIEF DESCRIPTION OF THE DRAWINGS

FIG. 1 is a diagrammatic sectional view of a substrate fragment in process in accordance with an embodiment of the invention.

FIG. 2 is a view of the FIG. 1 substrate at a processing step subsequent to that shown by FIG. 1.

FIG. 8 is a view of the FIG. 7 substrate at a processing step subsequent to that shown by FIG. 7.

DETAILED DESCRIPTION OF EXAMPLE EMBODIMENTS

Figure 3:
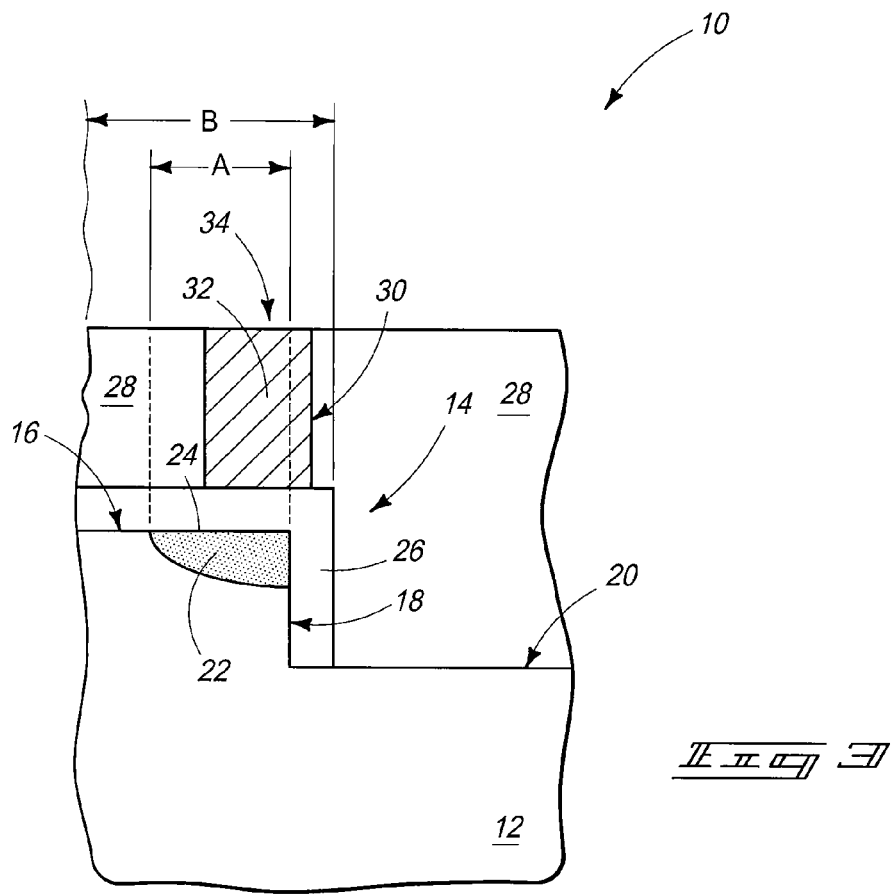
FIG. 3 is a view of the FIG. 2 substrate at a processing step subsequent to that shown by FIG. 2.

Example first embodiments of methods of forming a conductive contact are described with respect to a substrate 10 in FIGS. 1-3. Referring to FIG. 1, substrate 10 comprises substrate material 12 and may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate material 12 may be homogenous or non-homogenous, and may comprise multiple different composition materials and/or layers. A structure 14 has been formed relative to substrate material 12, and comprises an upper surface 16 joining with a sidewall surface 18 that joins with a surface 20. Structure 14 is shown as a simple step wherein sidewall surface 18 and upper surface 16 are each straight and join at an angle of about 90°. Other structures, for example including other angles and curving surfaces, may be used.

Sidewall surface 18 comprises elemental-form silicon along some or all of its length. Example materials are monocrystalline or polycrystalline silicon. In one embodiment, some or all of upper surface 16 comprises elemental-form silicon. Similarly, some or all of surface 20 may comprise elemental-form silicon.

Upper surface 16 may comprise a contact area 24 to which conductive electrical connection is to be made. Accordingly, contact area 24 may be considered as a node location which, in this example, is a diffusion region 22 which has been formed within substrate material 12. Contact area 24 may be of any size and shape, and is shown as having an example lateral expanse "A" in FIG. 1. Expanse or location A may be considered as a targeting area for making electrical connection relative to contact area 24.

Referring to FIG. 2, silicon 26 has been epitaxially grown laterally from sidewall surface 18. Such has also been grown elevationally from upper surface 16. Such may be conductively doped with a suitable conductivity enhancing impurity during or subsequent to such growth, thereby rending material 26 electrically conductive. Targeting area A in this example has thereby been enlarged or laterally widened to dimension B. In one embodiment, the epitaxial growth is sufficiently great to increase contact area 24 by at least 50%. Silicon 26 may be epitaxially grown by any suitable existing or yet-to-be developed technique. For example, such can be grown by vapor-phase-epitaxy using $SiCl_4$ and $H_2$ as source precursors at about 1200° C. As alternate examples, such may be grown using silane, dichlorosilane, and/or trichlorosilane as source gases.

Referring to FIG. 3, dielectric material 28 has been formed over upper surface 16 and epitaxially-grown silicon 26. Such may be homogenous or non-homogenous, with doped silicon dioxide (i.e., borosilicate glass, phosphosilicate glass, borophosphosilicate glass, etc) and silicon nitride being examples. A contact opening 30 has subsequently been etched through dielectric material 28, for example being targeted to overlie the targeting area represented by enlarged dimension B. Such has been filled with one or more suitable conductive materials 32, thereby forming a conductive contact 34. Such provides but one example of forming a conductive contact through dielectric material to conductively connect with upper surface 16, in this example through epitaxially-grown silicon 26. In one embodiment and as shown, the conductive contact physically touches the epitaxially-grown silicon. In one embodiment, conductive contact 34 may be received entirely within the confines of lateral dimension A (not shown). Alternately as shown, such may extend beyond the borders of lateral dimension A and into expanse B received laterally outward thereof.

Figure 4:
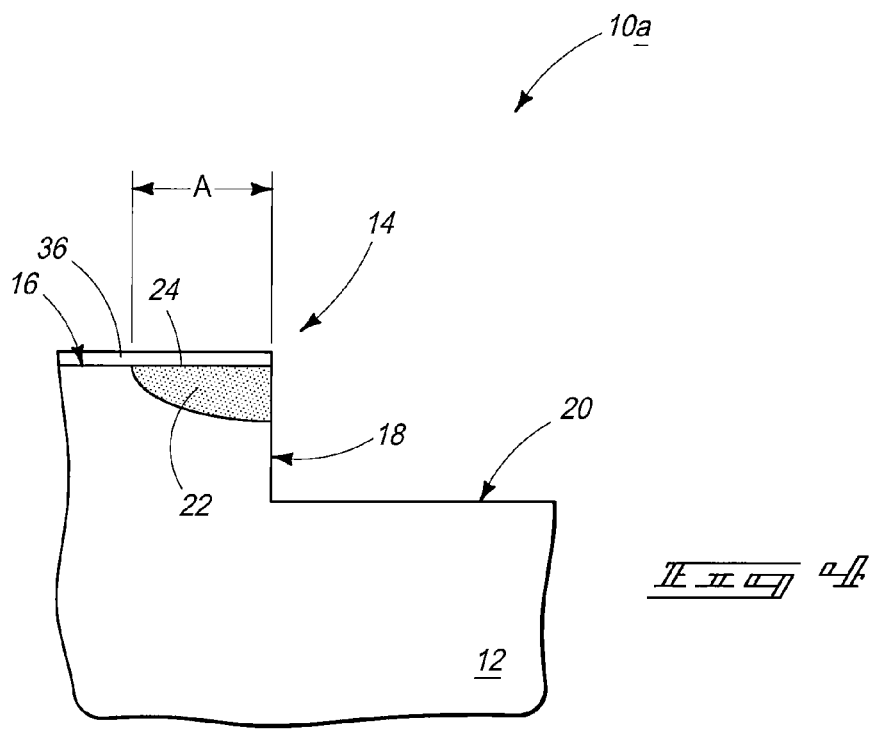
FIG. 4 is a diagrammatic sectional view of another substrate fragment in process in accordance with an embodiment of the invention.

Processing relative to another embodiment substrate fragment 10a is next described with reference to FIGS. 4-6. Like numerals from the above-described embodiments have been used where appropriate, with some construction differences being indicated with the suffix "a" or with different numerals. Referring to FIG. 4, substrate 10a differs from substrate 10 of FIG. 1 in having upper surface 16 masked with material 36. Such may be homogenous or non-homogenous comprising multiple different compositions and/or layers. Silicon dioxide and/or silicon nitride are examples. Outermost surfaces of material 36 may comprise no or insufficient elemental-form silicon such that no epitaxial growth may occur there-from.

Figure 5:
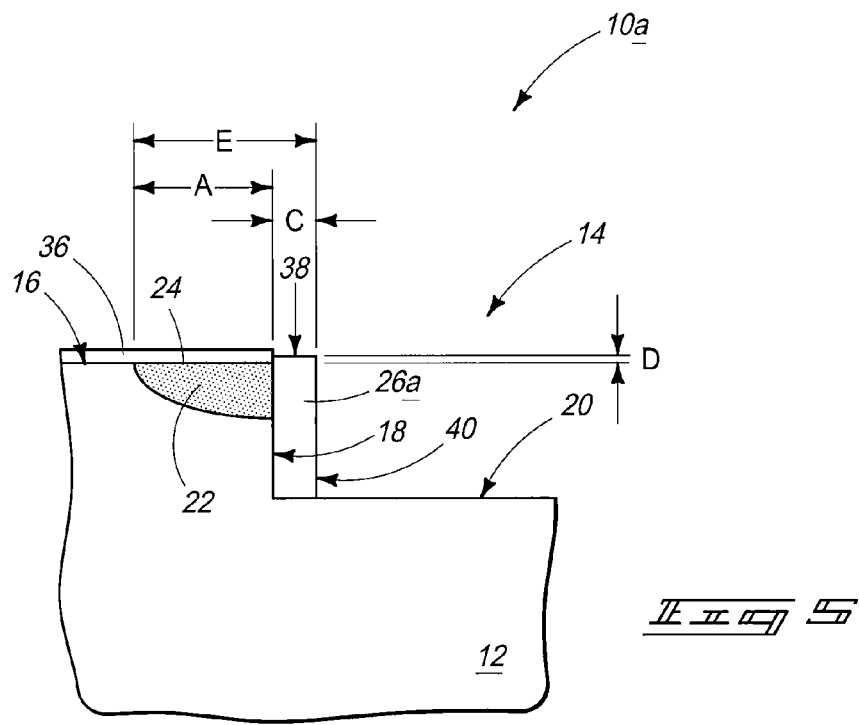
FIG. 5 is a view of the FIG. 4 substrate at a processing step subsequent to that shown by FIG. 4.

Referring to FIG. 5, silicon 26a has been epitaxially grown laterally from sidewall surface 18. Material 36 masks upper surface 24 so that no silicon epitaxially grows there-from during the epitaxially growing of silicon laterally from sidewall surface 18. In one embodiment, epitaxially-grown silicon 26a may have an upper-most surface 38 which is higher than upper surface 16. In one embodiment, epitaxially-grown silicon 26a has a laterally outermost surface 40 which is further from sidewall surface 18 than is upper-most surface 38 from upper surface 16. Specifically, laterally outermost surface 40 is shown at a distance C from sidewall surface 18 and upper-most surface 38 is shown at a distance D from upper surface 16, with C being greater than D. Regardless, FIG. 5 depicts lateral expanse A of contact area 24 as having been increased to a lateral expanse E, thereby increasing the targeting area.

Figure 6:
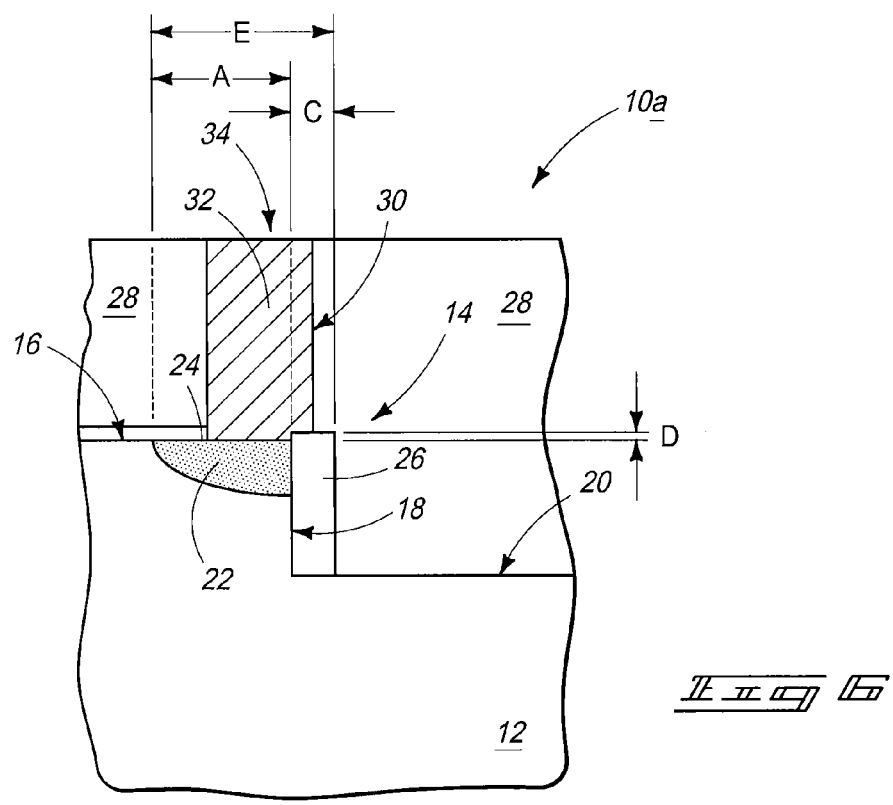
FIG. 6 is a view of the FIG. 5 substrate at a processing step subsequent to that shown by FIG. 5.

Referring to FIG. 6, processing has occurred analogous to that described above wherein a conductive contact 34 has been formed through dielectric material 28 to conductively connect with upper surface 16. Such conductive contact may or may not overlie epitaxially-grown silicon 26a, may or may not physically touch such if it does so overlie, and may or may not physically touch upper surface 16.

Figure 7:
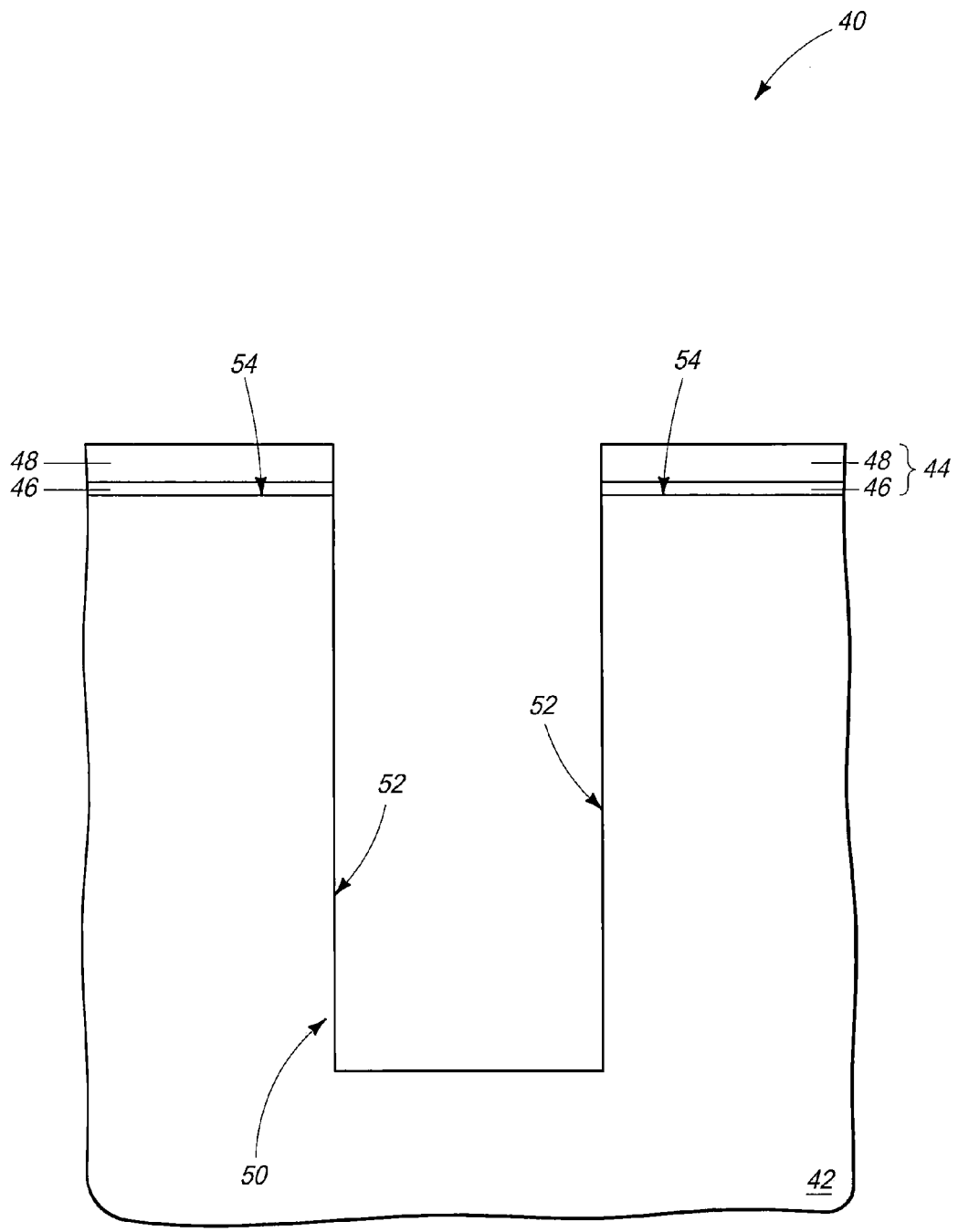
FIG. 7 is a diagrammatic sectional view of another substrate fragment in process in accordance with an embodiment of the invention
Figure 5B:
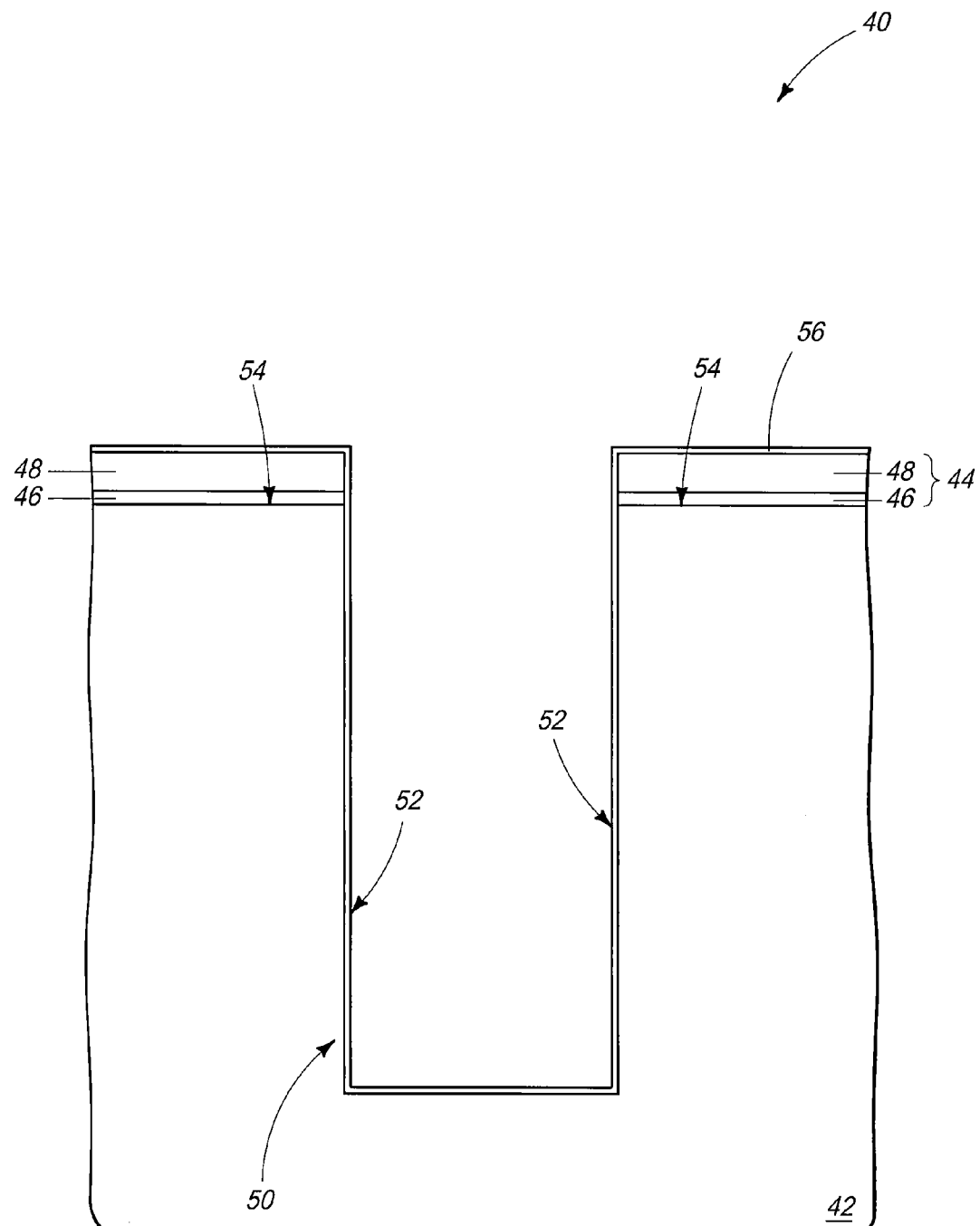

Additional embodiments are next described with respect to FIGS. 7-14 in a method of forming, in some embodiments, a pair of conductive contacts and, in some embodiments, of forming a conductive contact to a source/drain area in the fabrication of a transistor. Like numerals from the above-described embodiments have been used where appropriate, with some construction differences being indicated with different numerals. Referring to FIG. 7, a substrate 40 includes semiconductive material 42. Such may be homogenous or non-homogenous, with polycrystalline silicon and monocrystalline silicon being examples. A hard-mask 44 has been formed over semiconductive material 42, and comprises layers 46 and 48. Each may be homogenous or non-homogenous, with an example material 46 being undoped silicon dioxide and an example material 48 being silicon nitride and/or carbon. One or more anti-reflective coatings (not shown) may also be used. Hard-mask 44 has been used as a mask in forming a trench 50 into semiconductive material 42, for example by anisotropic dry etching. Trench 50 may be longitudinally elongated, for example extending into and out of the plane of the page upon which FIG. 7 lies. Trench 50 comprises opposing sidewall surfaces 52 which individually join with upper surfaces 54 on opposing sides of trench 50. Sidewall surfaces 52 comprise elemental-form silicon along at least some portions of their respective lengths, including along upper portions thereof. In one embodiment, upper surfaces 54 comprise elemental-form silicon. Regardless, upper surfaces 54 comprise contact areas to which individual of the conductive contacts of the pair are to electrically connect as will apparent in the continuing discussion. In one embodiment, upper surfaces 54 will comprise respective source/drain areas of one or more transistors being fabricated.

Referring to FIG. 8, a gate dielectric 56 has been formed within trench 50 over sidewall surfaces 52. Such may be homogenous or non-homogenous, with silicon dioxide and/or silicon nitride being examples.

Figure 9:
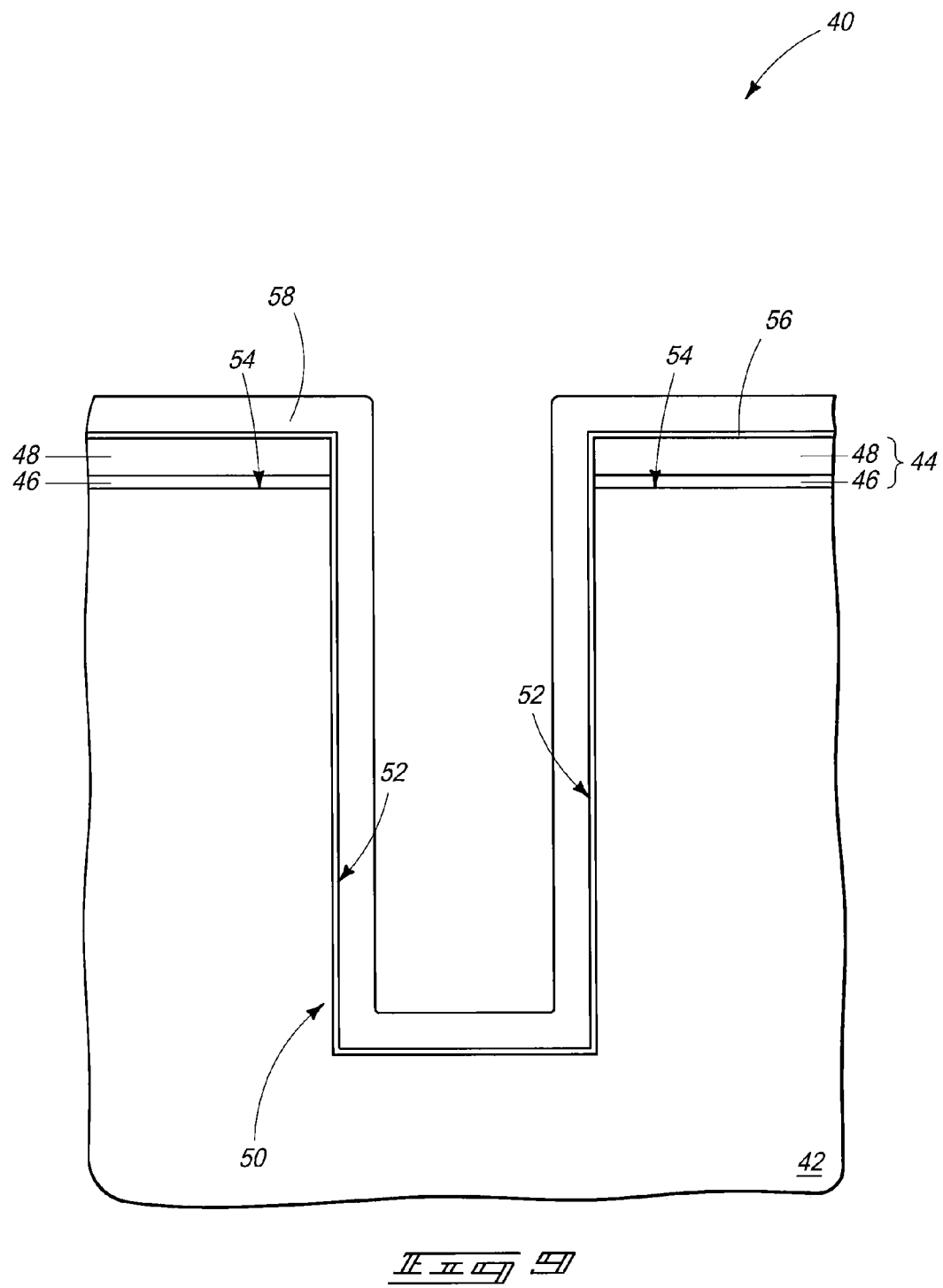
FIG. 9 is a view of the FIG. 8 substrate at a processing step subsequent to that shown by FIG. 8.

Referring to FIG. 9, conductive gate material 58 has been formed within trench 50 to laterally cover upper sidewall portions of gate dielectric 56. Conductive material 58 may be homogenous or non-homogenous, with conductively doped polysilicon and/or titanium nitride being examples.

Figure 10:
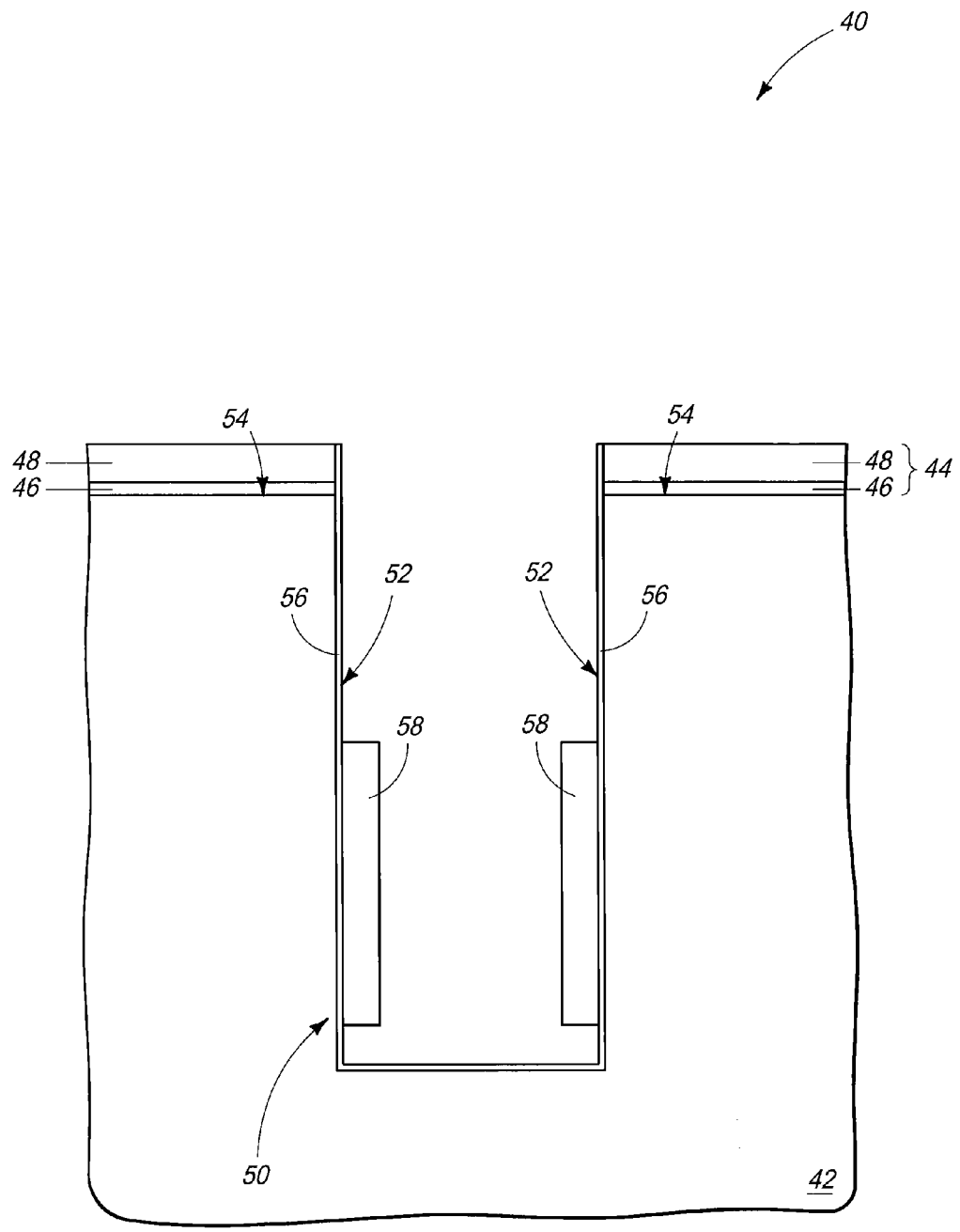
FIG. 10 is a view of the FIG. 9 substrate at a processing step subsequent to that shown by FIG. 9.

Referring to FIG. 10, an upper portion of conductive gate material 58 has been removed to expose an upper sidewall portion of gate dielectric 56 within that portion of trench 50 which is within semiconductive material 42. Any suitable timed dry anisotropic etch may be used. Such may also etch some of conductive gate material 58 from being received laterally over gate dielectric 56 at lowest-most sidewall portions thereof, for example as shown.

Figure 11:
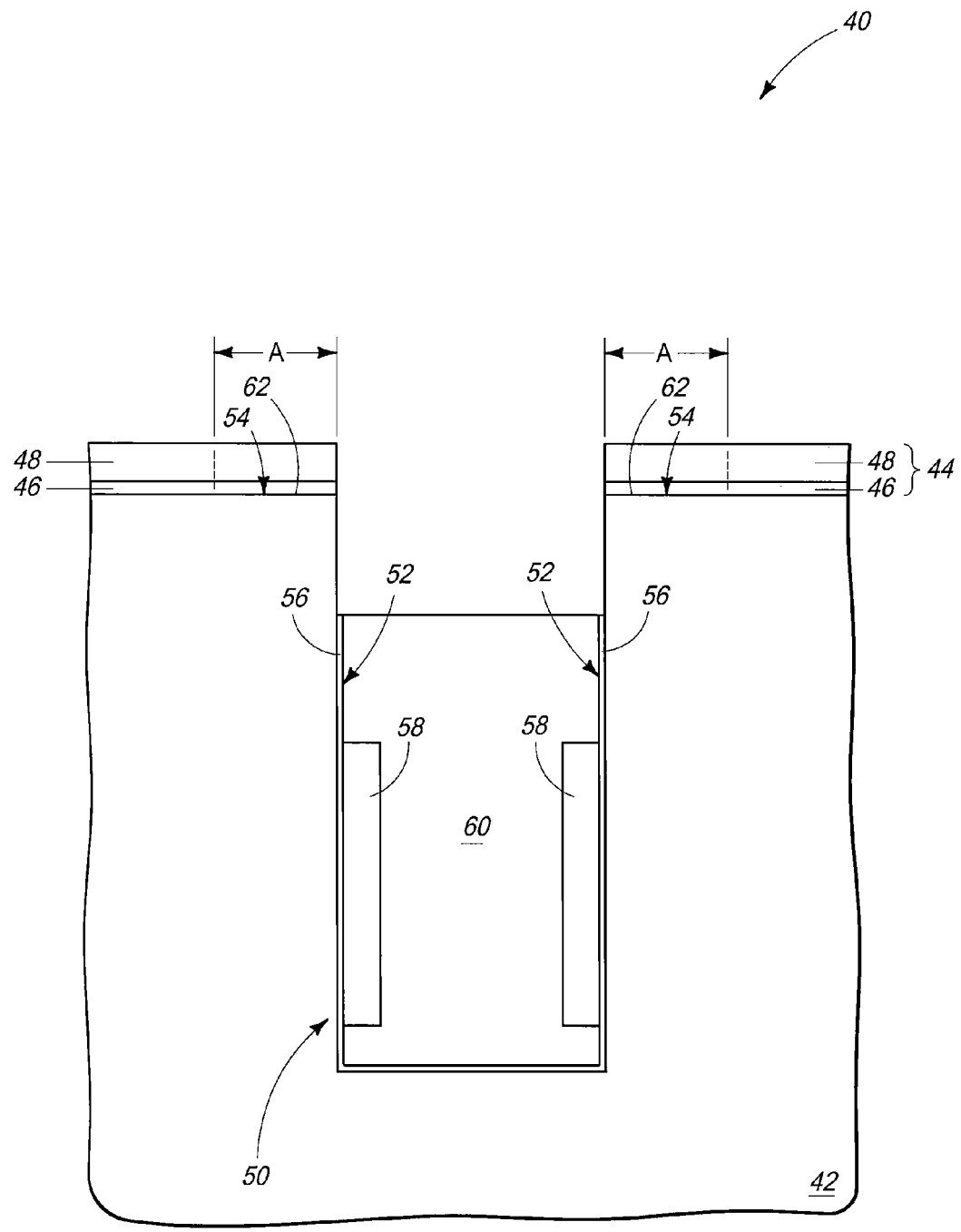
FIG. 11 is a view of the FIG. 10 substrate at a processing step subsequent to that shown by FIG. 10.

Referring to FIG. 11, a suitable dielectric 60 has been deposited and subsequently recessed within trench 50. An example dielectric material 60 is silicon dioxide, for example in the form of a spin-on-dielectric. Gate dielectric 56 has also been removed from the upper portions of trench sidewalls 52 of material 42 to expose elemental-form silicon of trench sidewalls 52 where such join with upper surfaces 54. Such may be conducted using any suitable wet or dry etching technique(s). Some of masking material 44 may be etched (not shown) previously or during such etching. The removing of outer portions of materials 60 and 56 as shown in FIG. 11 may occur in the same step or in different steps. For example, where materials 60 and 56 are of the same composition or of different compositions capable of being etched with the same etching chemistry, such might be removed in the same etching step. Alternately if such are of different compositions, etching of materials 60 and 56 might occur in separate etching steps.

The above processing describes but one method of masking opposing lower portions of sidewall surfaces 52 and leaving opposing upper portions of sidewall surfaces 52 exposed. In one embodiment, such opposing upper portions of the sidewall surfaces are planar and parallel one another. In one embodiment, upper surfaces 54 are planar, in one embodiment are co-planar, and the opposing upper portions of sidewall surfaces 52 extend perpendicularly relative to such co-planar upper surfaces 54. In one embodiment, lower portions of sidewall surfaces 52 are masked with insulative material, for example with material 56 as shown. In one embodiment, lower portions of sidewall surfaces 52 are masked with conductive material, for example with material 58 as shown. In one embodiment, the lower portions are masked with insulative material and with conductive material, and in one embodiment with the insulative material being received between the conductive material and the sidewall surfaces of the lower portions, for example as shown.

Upper surfaces 54 comprise contact areas 62 to which individual of the conductive contacts of the pair are to electrically connect. In one embodiment, such contact areas will comprise respective source/drain regions of a field effect transistor. Regardless, each is depicted as comprising a respective lateral expanse "A" which exemplifies a targeting area for forming electrical contact with contact area 62.

Figure 12:
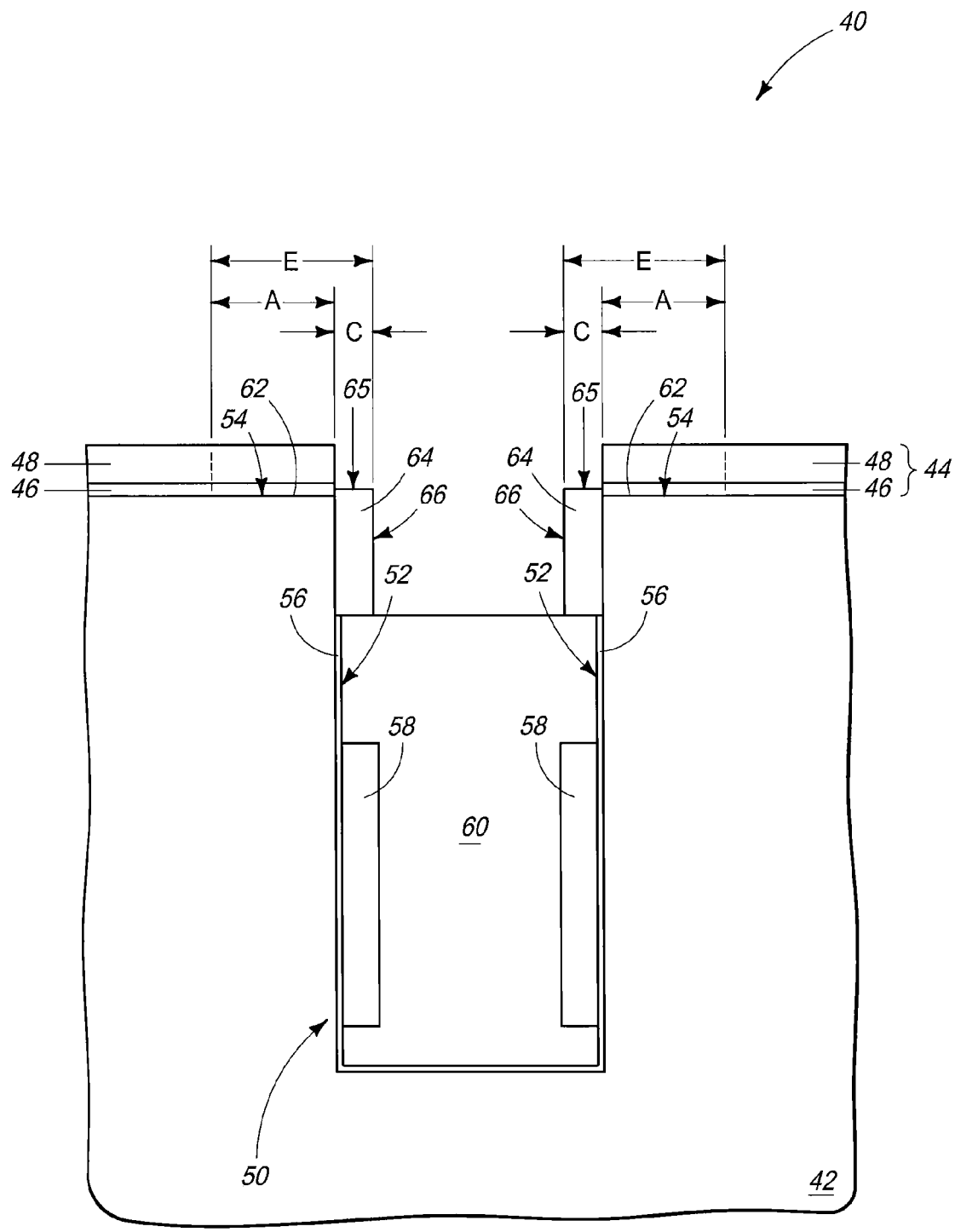
FIG. 12 is a view of the FIG. 11 substrate at a processing step subsequent to that shown by FIG. 11.

Referring to FIG. 12, opposing silicon blocks 64 have been epitaxially grown toward one another from opposing exposed upper portions of sidewall surfaces 52 of material 42 above the masked lower portions of sidewall surfaces 52 to effectively increase upper surface area of contact areas 62. In one embodiment, the epitaxial growth forms the opposing blocks of the pair to each be of the same size. In one embodiment, upper surfaces 54 are masked during such epitaxial growth such that no silicon epitaxially grows there-from where such comprises elemental-form silicon during the epitaxially growing of the silicon blocks from the exposed opposing upper portions of sidewall surfaces 52. For example in the depicted embodiment, at least some of masking material 44 has remained over substrate 40 during such epitaxial growing of silicon blocks 64. FIG. 12 depicts an increase of the upper surface area for electrically connecting with contact areas 62 represented by increased lateral expanse B.

As with the first-described embodiments, such epitaxial growth may form the epitaxially-grown silicon to have an upper-most surface which is higher than upper surfaces 54, for example as shown with respect to upper-most surfaces 65 of silicon blocks 64 relative to upper surfaces 54 of semiconductive material 42. Further, analogously to the first-described embodiments, epitaxially-grown silicon blocks 64 may have a respective laterally outermost surface 66 which is further from sidewall surface 52 from which each is grown than are the respective upper-most surfaces 65 from upper surfaces 54.

Figure 13:
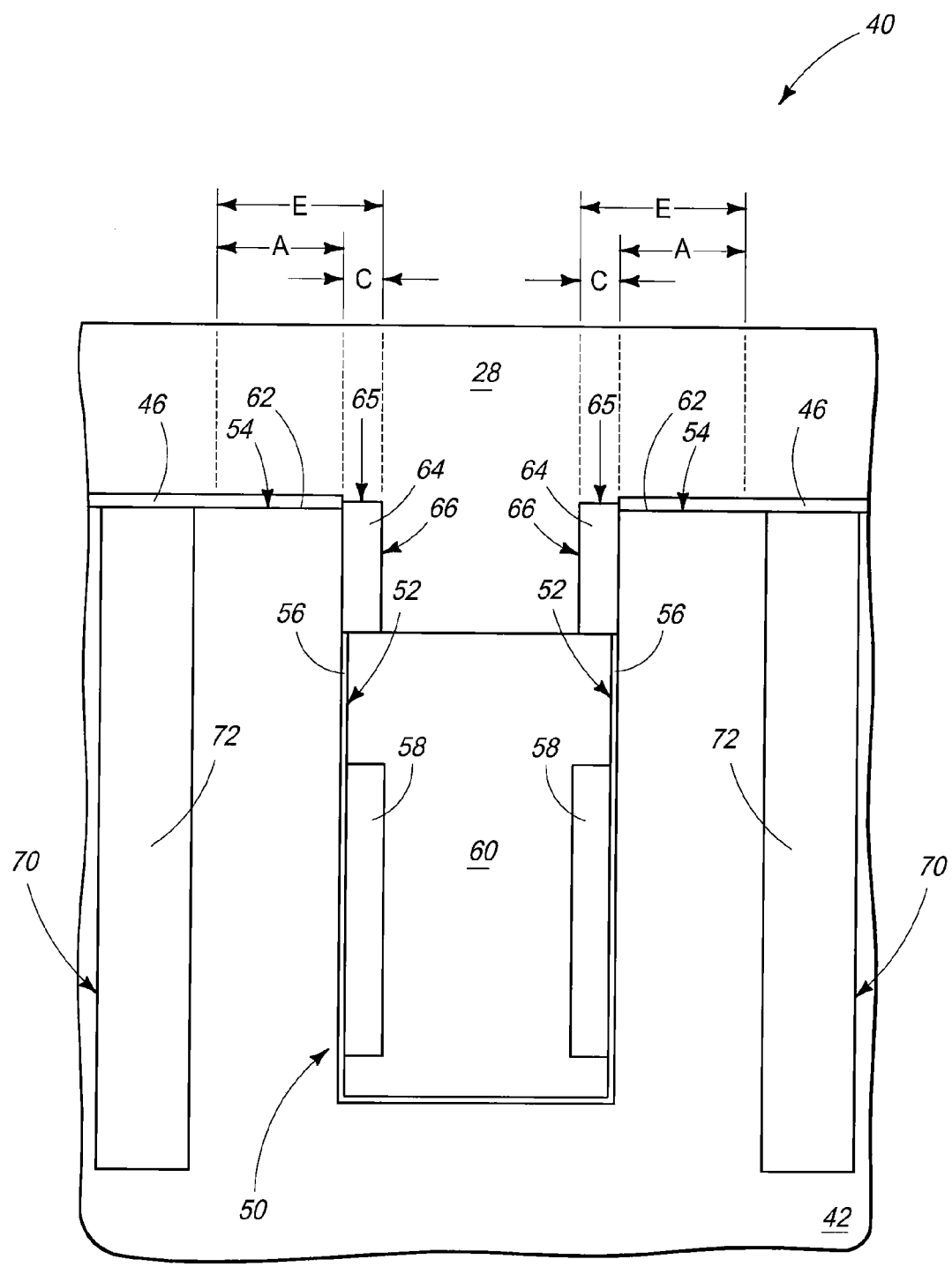
FIG. 13 is a view of the FIG. 12 substrate at a processing step subsequent to that shown by FIG. 12.

Referring to FIG. 13, isolation trenches 70 have been formed within semiconductive material 42 and filled with dielectric material 72. Material 48 (not shown) has been removed, and dielectric material 28 has been formed over upper surface 54 and epitaxially-grown silicon block 64. Alternate and/or additional processing may occur.

Figure 14:
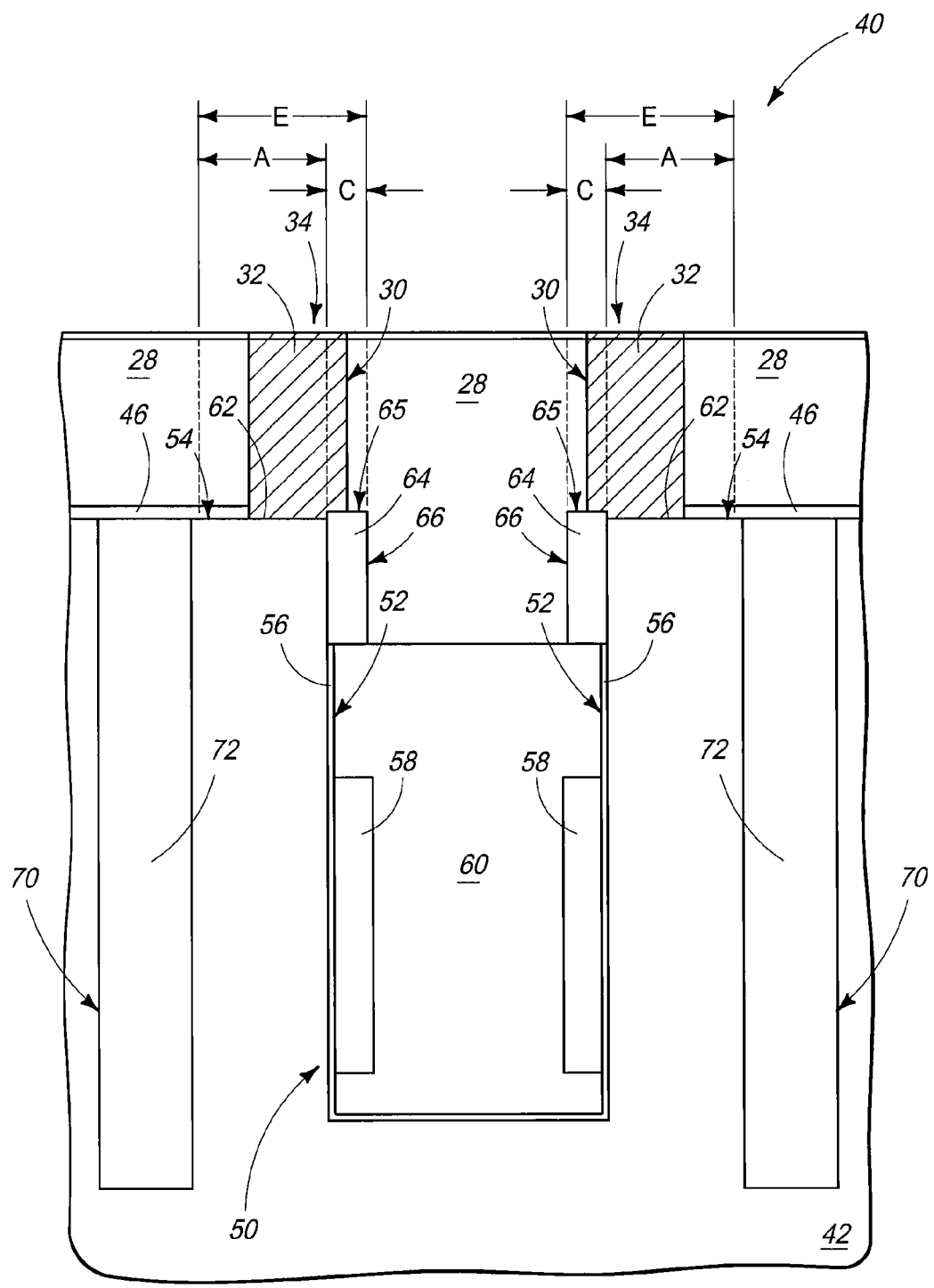
FIG. 14 is a view of the FIG. 13 substrate at a processing step subsequent to that shown by FIG. 13.

Referring to FIG. 14, contact openings 30 have been etched through dielectric material 28 and filled with conductive material 32 to form a pair of conductive contacts 34. Such extend through dielectric material 28 and individually conductively connect to a respective one of contact areas 62, which in one embodiment comprise upper surfaces of a respective source/drain region. At least one of the pair of conductive contacts 34 may overlie one of the epitaxially-grown silicon blocks, and if so may physically touch such epitaxially-grown silicon block, for example as shown. In one embodiment and in spite of the increase in contact area, the conductive contact may be received entirely within (not shown) lateral expanse A of contact area 62.

Processing as described above, may provide greater area of contact between a conductive contact and an underlying node location, thereby reducing contact resistance. The above processing might be used in fabrication of memory circuitry, for example in DRAM circuitry of a cross-hair architecture.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a conductive contact, comprising:
    forming a structure comprising an upper surface joining with a sidewall surface, the sidewall surface comprising elemental-form silicon;
    epitaxially growing silicon laterally from the sidewall surface;
    forming dielectric material over the upper surface and the epitaxially-grown silicon; and
    forming a conductive contact through the dielectric material to conductively connect with the upper surface.

2. The method of claim 1 wherein the upper surface comprises elemental-form silicon.

3. The method of claim 2 comprising epitaxially growing silicon elevationally from the upper surface while epitaxially growing silicon laterally from the sidewall surface.

4. The method of claim 2 comprising masking the upper surface so that no silicon epitaxially grows there-from during the epitaxially growing of silicon laterally from the sidewall surface.

5. The method of claim 2 wherein the epitaxially-grown silicon has an upper-most surface which is higher than the upper surface.

6. The method of claim 5 wherein the epitaxially-grown silicon has a laterally outermost surface which is further from the sidewall surface than is the upper-most surface of the epitaxially-grown silicon from the upper surface.

7. The method of claim 1 wherein the conductive contact overlies the epitaxially-grown silicon.

8. The method of claim 7 wherein the conductive contact physically touches the epitaxially-grown silicon.

9. A method of forming a pair of conductive contacts, comprising:
    forming a trench into semiconductive material, the trench comprising opposing sidewall surfaces which individually join with upper surfaces on opposing sides of the trench, the sidewall surfaces comprising elemental-form silicon, the upper surfaces comprising contact areas to which individual of the conductive contacts of the pair are to electrically connect;
    masking opposing lower portions of the sidewall surfaces and leaving opposing upper portions of the sidewall surfaces exposed;
    epitaxially growing opposing silicon blocks toward one another from the opposing exposed upper portions of the sidewall surfaces above the masked opposing lower portions of the sidewall surfaces to increase upper surface area of the contact areas;
    forming dielectric material over the upper surfaces and the epitaxially-grown silicon blocks; and
    forming a pair of conductive contacts through the dielectric material which individually conductively connect to a respective one of the contact areas.

10. The method of claim 9 wherein the semiconductive material consists essentially of elemental-form silicon.

11. The method of claim 9 wherein the epitaxially growing is sufficiently great to increase the contact areas by at least 50% each.

12. The method of claim 9 wherein the epitaxially growing forms the opposing blocks of the pair to each be of the same size.

13. The method of claim 9 wherein the opposing upper portions of the sidewall surfaces are planar and parallel one another.

14. The method of claim 13 wherein the upper surfaces of the contact areas are planar.

15. The method of claim 14 wherein the upper surfaces of the contact areas are coplanar, the opposing upper portions of the sidewall surfaces extending perpendicularly relative to the coplanar upper surfaces.

16. The method of claim 9 wherein the lower portions are masked with insulative material.

17. The method of claim 9 wherein the lower portions are masked with conductive material.

18. The method of claim 9 wherein the lower portions are masked with insulative material and with conductive material.

19. The method of claim 18 wherein the insulative material is received between the conductive material and the sidewall surfaces of the lower portions.

20. The method of claim 9 wherein the upper surfaces comprise elemental-form silicon.

21. The method of claim 20 comprising masking the upper surfaces so that no silicon epitaxially grows there-from during the epitaxially growing of the silicon blocks from the exposed opposing upper portions of the sidewall surfaces.

22. The method of claim 9 wherein at least one of the pairs of conductive contacts overlies one of the epitaxially-grown silicon blocks.

23. The method of claim 22 wherein said one conductive contact physically touches said one epitaxially grown-silicon block.

24. The method of claim 9 comprising epitaxially growing the silicon blocks to have respective upper-most surfaces which are higher than the upper surfaces.

25. The method of claim 24 wherein the epitaxially-grown silicon blocks have a respective laterally outermost surface which is further from the sidewall surface from which each is grown than are the respective upper-most surfaces of the silicon blocks from the upper surfaces.

26. A method of forming a conductive contact to a source/drain area in the fabrication of a transistor, comprising:
  forming a trench into semiconductive material, the trench comprising a sidewall surface which joins with an upper surface, the upper and sidewall surfaces comprising elemental-form silicon, the upper surface comprising a source/drain area;
  forming a gate dielectric within the trench over the sidewall surface;
  forming conductive gate material within the trench to laterally cover an upper sidewall portion of the gate dielectric;
  removing an upper portion of the conductive gate material and the gate dielectric from the upper sidewall portion to expose elemental-form silicon of the trench sidewall where it joins with the upper surface of the source/drain area;
  with the upper surface of the source/drain area masked, epitaxially growing silicon laterally from the exposed elemental-form silicon of the upper sidewall portion to increase upper surface area of the source/drain area;
  forming dielectric material over the upper surface and the epitaxially-grown silicon; and
  forming a conductive contact through the dielectric material to conductively connect with the upper surface of the source/drain region.

* * * * *